(12) United States Patent
Iijima

(10) Patent No.: US 7,488,894 B2
(45) Date of Patent: *Feb. 10, 2009

(54) CONDUCTIVE FILM FOR TRANSFER, METHOD FOR FORMING TRANSPARENT CONDUCTIVE FILM USING SAME, AND TRANSPARENT CONDUCTIVE FILM

(75) Inventor: Tadayoshi Iijima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/570,197

(22) PCT Filed: Aug. 26, 2004

(86) PCT No.: PCT/JP2004/012707

§ 371 (c)(1),
(2), (4) Date: Mar. 2, 2006

(87) PCT Pub. No.: WO2005/022559

PCT Pub. Date: Mar. 10, 2005

(65) Prior Publication Data

US 2006/0286316 A1    Dec. 21, 2006

(30) Foreign Application Priority Data

Sep. 2, 2003    (JP)   ............... 2003-309527

(51) Int. Cl.
*H01B 7/00*    (2006.01)
(52) U.S. Cl. .................................. 174/117 A
(58) Field of Classification Search ............... 174/36, 174/117 F, 117 A
See application file for complete search history.

(56) References Cited

U.S. PATENT DOCUMENTS

| 3,516,911 | A * | 6/1970 | Hopps, Jr. | 205/53 |
| 2001/0008717 | A1* | 7/2001 | Iijima | 428/702 |
| 2002/0086138 | A1* | 7/2002 | Iijima | 428/141 |
| 2002/0168478 | A1* | 11/2002 | Kato et al. | 427/404 |

FOREIGN PATENT DOCUMENTS

JP    5-166414    7/1993

(Continued)

*Primary Examiner*—Chau N Nguyen
(74) *Attorney, Agent, or Firm*—Oblon, Spivak, McClelland, Maier & Neustadt, P.C.

(57) ABSTRACT

The present invention provides a electrical conductive film for transfer in order to furnish a surface of an article, even an article poor in flexibility such as a board material, with a transparent electrical conductive film having a uniform thickness and having a lower electric resistance value; a method for forming a transparent electrical conductive film using the same; and a transparent electrical conductive film. An electrical conductive film for transfer comprising at least a conductive layer 4 on a support 1, said conductive layer 4 being releasable from the support 1, wherein the conductive layer 4 comprises conductive fine particles and an organic group-containing metal compound of a metal element, an oxide of which exhibits the electrical conductivity. The electrical conductive film for transfer is stuck on a surface of an object article to be furnished with the transparent electrical conductive film through an adhesive layer 5, then the adhesive layer is cured after the sticking and the support 1 is released, and subsequently heat treatment is performed to convert the organic group-containing metal compound in the conductive layer 4 into metal oxide.

9 Claims, 3 Drawing Sheets

FOREIGN PATENT DOCUMENTS

| | | | |
|---|---|---|---|
| JP | 6-103839 | | 4/1994 |
| JP | 7-262840 | | 10/1995 |
| JP | 8-199096 | | 8/1996 |
| JP | 08-199139 | * | 8/1996 |
| JP | 2000-207959 | | 7/2000 |
| JP | 2001-002954 | | 1/2001 |
| JP | 2003-1783 | | 1/2003 |
| JP | 2003-16842 | | 1/2003 |
| JP | 2003-123544 | | 4/2003 |
| JP | 2003-249125 | | 9/2003 |
| WO | 01/87590 | | 11/2001 |

* cited by examiner (a)

(b)

(c)

(b)     (c)

CONDUCTIVE FILM FOR TRANSFER, METHOD FOR FORMING TRANSPARENT CONDUCTIVE FILM USING SAME, AND TRANSPARENT CONDUCTIVE FILM

TECHNICAL FIELD

The present invention relates to an electrical conductive film for transfer, a method for forming transparent electrical conductive film using the same, and a transparent electrical conductive film.

The transparent electrical conductive film can be used as a transparent electrode such as a plasma display panel electrode, an electroluminescence panel electrode, an electrochromic element electrode, a liquid crystal electrode, a transparent plane heater, or a touch panel, and can be also used as a transparent electromagnetic-wave shielding film.

BACKGROUND ART

At present, the transparent electrical conductive film is produced mainly by the sputtering method. There are various modes for the sputtering method, for example, a method of forming a film by allowing inert gas ions, which are generated by direct current or high-frequency discharge, to be accelerated to hit the surface of a target in vacuum so as to strike out atoms constituting the target from the surface for deposition on the substrate surface.

The sputtering method is excellent in that an electrical conductive film having a low surface electric resistance can be formed even if it has a large area to some extent. However, it has a disadvantage that the apparatus is large, and the film forming speed is slow. If the conductive film is to have a still larger area from now on, the apparatus will be further enlarged. This raises a technical problem such that the controlling precision must be heightened and, from another point of view, raises a problem of increase in the production cost. Further, although the number of targets is increased to raise the speed in order to compensate for the slowness of the film forming speed, this also is a factor that enlarges the apparatus, thereby raising a problem.

An attempt is made to produce the transparent conductive film by the application method. In a conventional application method, a conductive paint having conductive fine particles dispersed in a binder solution is applied onto a substrate, dried, and hardened to form the conductive film. The application method has advantages in that a conductive film having a large area can be easily formed, that the apparatus is simple and has a high productivity, and that the conductive film can be produced at a lower cost than by the sputtering method. In the application method, an electric path is formed by contact of the conductive fine particles with each other, whereby the electrical conductivity is exhibited. However, the conductive film produced by the conventional application method has an insufficient contact, and the obtained conductive film has a high electric resistance value (i.e. is inferior in conductivity), thereby limiting its usage.

As an application method using no binder resin, for example, Japanese Laid-open Patent Publication No. 8-199096(1996) discloses a method in which a conductive film forming paint comprising tin-doped indium oxide (ITO) powders, a solvent, a coupling agent and an organic or inorganic acid salt of metal, and not containing a binder is applied onto a glass plate and calcined at a temperature of 300° C. or higher. In this method, since the binder is not used, the conductive film has a low electric resistance value.

Also, a process is known in which a film is formed by application using the sol-gel method. An application method using the sol-gel method is suited for forming a film of large area.

By any of the above-mentioned application methods, in the case that the support is one having flexibility such as a film, a conductive film having a large area can be easily formed, however, in the case that the support is one having poor flexibility such as a plate material, the application is difficult as compared with the case of the flexible support, and particularly it is difficult to control a film thickness for uniformity.

Japanese Laid-open Patent Publication No. 6-103839 (1994) discloses a method for manufacturing a transparent conductive substrate by transferring.

Also, Japanese Laid-open Patent Publication No. 2000-207959(2000) discloses a method in which a coating liquid for forming a conductive film containing an organic indium compound, expressed by structural formula $In(OH)(OCOR)_2$ (here, R is alkyl groups that may be a branch or straight chain), and an organic tin compound dissolved in a solvent is applied onto a base material such as glass; and subsequently heat treated to decompose the organic component of the coating liquid by heat thus forming a transparent conductive film. In this method, a conductive film having a low specific resistance can be obtained. In this method, however, when it is tried to obtain a thick conductive film, a crack is produced at the time of heat treatment. Thus, a conductive film having a low surface electric resistance cannot be obtained.

Further, Japanese Laid-open Patent Publication No. 2001-2954(2001) discloses a method in which a coating liquid for forming conductive film containing a formic acid indium compound, an organic tin compound and an organic amine dissolved in a solvent is applied onto a base material such as glass; and subsequently heat treated to decompose the organic component of the coating liquid by heat thus forming a transparent conductive film.

DISCLOSURE OF THE INVENTION

Object of the Invention

The present inventor suggested, in WO 01/87590, an electrical conductive film for transfer having a transparent conductive layer in order to furnish an article poor in flexibility, such as a board material, with the transparent conductive layer which has a uniform thickness; an article furnished with the conductive layer; and a method for producing the article furnished with the conductive layer. WO 01/87590 discloses that a conductive film having a low electric resistance value can be obtained by compressing a layer containing conductive fine particles which is formed by application to form a compressed layer of conductive fine particles. Namely, the contact points among the conductive fine particles are increased by compressing the conductive fine particles and the electric resistance value is decreased. After the compression, voids occur among the conductive fine particles.

There are demands for conductive films having still lower electric resistance values in accordance with purposes and usages.

The present inventor has further studied, and found out that a conductive film having a still lower electric resistance value can be obtained by allowing a metal oxide component having an electrical conductivity to exist in the voids among the conductive fine particles after the compression.

Thus, an object of the present invention is to provide a conductive film for transfer in order to form onto a surface of an article, even an article poor in flexibility such as a board material, a transparent electrical conductive film having a uniform thickness and a lower electric resistance value; a method for forming a transparent conductive film using the same; and a transparent conductive film. Further, an object of the present invention is to provide a transparent conductive film having a low electric resistance value, with which a crack is not easily produced even when the thickness of the film is made to be thick.

SUMMARY OF THE INVENTION

The present invention includes the following.
(1) A electrical conductive film for transfer comprising at least a conductive layer on a support, said conductive layer being releasable from the support,
wherein the conductive layer comprises conductive fine particles and an organic group-containing metal compound of a metal element, an oxide of which exhibits an electrical conductivity. The support has flexibility.
(2) The electrical conductive film for transfer according to (1), wherein a metal element of the organic group-containing metal compound is selected from the group consisting of indium, antimony, tin, zinc, and gallium.
(3) The electrical conductive film for transfer according to (1) or (2), wherein the conductive layer is a layer of conductive fine particles being impregnated with the organic group-containing metal compound.
(4) The electrical conductive film for transfer according to (3), wherein the layer of conductive fine particles is a compressed layer of conductive fine particles. The compressed layer of the conductive fine particles can be obtained by compressing a layer comprising the conductive fine particles which is formed onto a support by applying a dispersion liquid of the conductive fine particles and drying the liquid. The compressed layer of the conductive fine particle is preferably obtained by carrying out the compression at a compression force of 44 N/mm$^2$ or more.

At the production of the conductive film for transfer, although the dispersion liquid of the conductive fine particles may contain a small amount of resin, it is particularly preferable that the dispersion liquid of the conductive fine particles does not contain a resin. In the case that the dispersion liquid contains a resin, the amount of the resin contained in the dispersion liquid is preferably less than 25 parts by volume with respect to 100 parts by volume of the conductive fine particles as represented by volume.

There are voids among the conductive fine particles in the compressed layer of the conductive fine particles. In these voids, the organic group-containing metal compound is impregnated as a precursor of a conductive metal oxide component. The impregnated organic group-containing metal compound is converted into a conductive metal oxide by heat treatment performed after the transfer to a surface of an object article. As a result, electric contacts among the conductive fine particles increase, thus a transparent conducive film having a lower electric resistance value can be obtained.
(5) The electrical conductive film for transfer according to any one of (1) to (4), wherein an adhesive layer comprising at least an acrylic type monomer (M) is further provided on the conductive layer.
(6) The electrical conductive film for transfer according to (5), wherein the adhesive layer further comprises at least one resin of
a polymer resin (P) selected from the group consisting of an acrylic type resin and a cellulose type resin, and a silicone type resin (S).
(7) The electrical conductive film for transfer according to (6), wherein the adhesive layer comprises the polymer resin (P) and the acrylic type monomer (M) at a weight ratio P/M of 0/10 to 8/2, and comprises the silicone type resin (S) at a weight ratio of the silicone type resin (S) to the total (P+M) of the polymer resin (P) and the acrylic type monomer (M), S/(P+M), of 0.01/100 to 50,000/100.
(8) A method for forming a transparent electrical conductive film, characterized by:
sticking the electrical conductive film for transfer according to any one of (1) to (7), onto a surface of an object article to be furnished with the transparent electrical conductive film so as to position the support outside through the adhesive layer of the film, and/or an adhesive layer comprising at least an acrylic type monomer (M) and being provided beforehand on the surface of an object article;
curing the adhesive layer after the sticking;
releasing the support; and then performing heat treatment to convert the organic group-containing metal compound in the conductive layer into a metal oxide.
(9) A transparent electrical conductive film comprising:
conductive fine particles which constitute a layer of conductive fine particles, and a metal oxide component which exists in the voids of the conductive fine particles and have the electrical conductivity.
(10) The transparent electrical conductive film according to (9), wherein the layer of conductive fine particles is a compressed layer of conductive fine particles.
(11) An article furnished with a transparent electrical conductive film comprising:
an adhesive layer on a surface of the article, and
a transparent electrical conductive film on the adhesive layer, said transparent electrical conductive film comprising conductive fine particles which constitute a layer of conductive fine particles, and a metal oxide component which exists in the voids of the conductive fine particles and have the electrical conductivity.
(12) The article furnished with the transparent electrical conductive film according to (11), wherein the layer of the conductive fine particles is a compressed layer of conductive fine particles.
(13) The article furnished with the transparent electrical conductive film according to (11) or (12), wherein the adhesive layer contains silicon dioxide as a main component.

In the conductive film for transfer of the present invention, the term "releasable" includes a case as illustrated in FIG. 1.

FIG. 1(a) shows a mode of release used in a usual sense, which is a mode in which a layer A and a layer B, which contact each other, are completely released from the interface therebetween.

FIGS. 1(b) and 1(c) show a mode of release in which a layer A and a layer B, which contact each other, are released from the interface therebetween, but a part of one layer A remains on another layer B. The case that a complete release is not attained as shown in FIG. 1(a), when it is microscopically viewed, is intended as releasable provided that each of the layers after release substantially constitutes a layer. The case of the present invention includes a case in which a conductive layer corresponds to the layer A in FIG. 1(b) or 1(c).

In the present invention, the phrase "a conductive layer releasable from a support" means a state that the support and the conductive layer can be released from each other. When the conductive film for transfer according to the present invention is actually used, its support is released from its conductive layer stuck through an adhesive layer on a surface of an object article in many cases.

In the conductive film for transfer according to the present invention, it is also preferable to provide an intermediate layer between the support and the conductive layer in order to allow the conductive layer to be easily released from the support at the time of transfer.

In the present invention, the conductive layer after the transfer may be patterned.

According to the present invention, a conductive film for transfer comprising a conductive layer having an excellent performance and exhibiting a superior electrical conductivity after heat treatment at a high temperature can be obtained by a series of simple operations of application, compression and impregnation of a precursor of a conductive metal oxide component. According to the present invention, formation of a transparent conductive film having a superior electrical conductivity is ensured by using the conductive film for transfer and performing heat treatment after the transfer to a surface of an object article. In particular, the present invention has an advantage in furnishing a transparent conductive film having uniform thickness to an object poor in flexibility such as a board material.

MODES FOR CARRYING OUT THE INVENTION

First, the electrical conductive film for transfer according to the present invention (hereinafter, simply referred to as conductive films) will be described.

Figure 1:
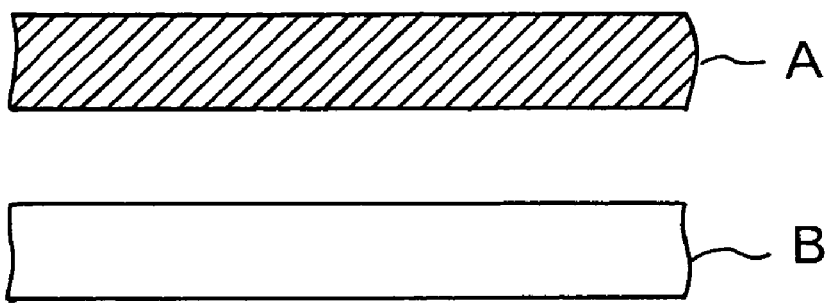
FIG. 1 is a view for describing modes of release.
Figure 1:
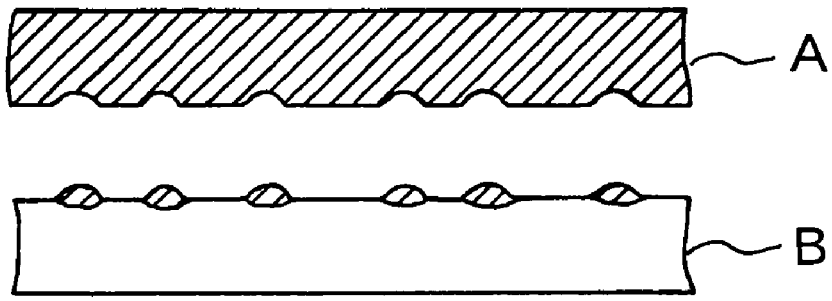
Figure 1:
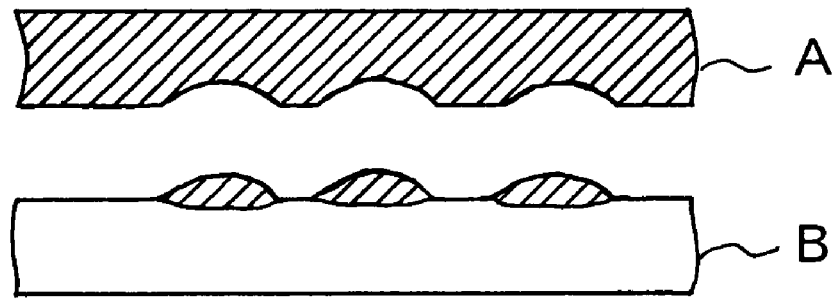
Figure 2:
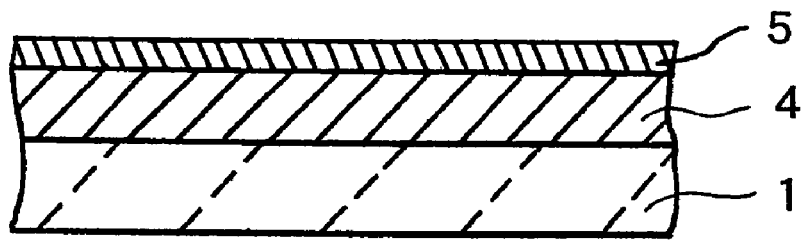
FIG. 2 is a cross-sectional view illustrating one example of the conductive film for transfer in the present invention.

FIG. 2 is a cross-sectional view illustrating a layer structure example of a conductive film wherein a conductive layer (4) is formed on a support (1) and an adhesive layer (5) is formed on the conductive layer (4).

In the present invention, conductive fine particles are used to form the conductive layer (4). For example, conductive inorganic fine particles are used such as indium oxide, tin-doped indium oxide (ITO), gallium-doped indium oxide, zinc-doped indium oxide, tin oxide, antimony-doped tin oxide (ATO), fluorine-doped tin oxide (FTO), zinc oxide, aluminum-doped zinc oxide (AZO), gallium-doped zinc oxide (GZO), fluorine-doped zinc oxide, indium-doped zinc oxide, boron-doped zinc oxide, cadmium oxide, or the like. In view of obtaining a more excellent conductivity, ITO is preferable. Alternatively, those in which the surface of fine particles such as barium sulfate having transparency is coated with an inorganic material such as ATO, ITO, or the like may be used. The particle diameter of these fine particles differs depending on the degree of scattering of light required in accordance with the usage of the conductive film, and may generally vary depending on the shape of the particles; however, it is generally 10 μm or less, preferably 1.0 μm or less, more preferably from 5 nm to 100 nm. In the present invention, those generally referred to as being translucent and having a scattering are also included.

In the present invention, a liquid in which conductive fine particles selected from the above-mentioned various conductive fine particles are dispersed therein is used as a conductive paint in accordance with the objects. The conductive paint is applied onto the support or onto an intermediate layer formed on the support and dried to form a layer containing the conductive fine particles. Thereafter, the layer containing the conductive fine particles is preferably compressed to form a compressed layer of the conductive fine particles.

The liquid for dispersing the conductive fine particles is not particularly limited, and various known liquids may be used. For example, as the liquid, saturated hydrocarbons such as hexane, aromatic hydrocarbons such as toluene and xylene, alcohols such as methanol, ethanol, propanol and butanol, ketones such as acetone, methyl ethyl ketone (MEK), methyl isobutyl ketone and diisobutyl ketone, esters such as ethyl acetate and butyl acetate, ethers such as tetrahydrofuran, dioxane and diethyl ether, amides such as N,N-dimethylformamide, N-methylpyrrolidone (NMP) and N,N-dimethylacetamide, halogenated hydrocarbons such as ethylene chloride and chlorobenzene, and others may be mentioned. Among these, liquids having a polarity are preferable, and in particular, alcohols such as methanol and ethanol, and amides such as NMP having an affinity with water are suitable because the dispersion is good without the use of a dispersant. These liquids can be used either alone or as a mixture of two or more kinds thereof. Further, a dispersant may be used depending on a kind of the liquid.

Also, water can be used as the liquid. If water is used as the liquid, the resin layer surface must be hydrophilic. The resin film and the resin layer are usually hydrophobic and are water-repellent, so that a uniform layer is not likely to be obtained. In the case described above, it is necessary to mix an alcohol with water or to make a hydrophilic surface of the resin layer by such a method as corona treatment.

The amount of the liquid to be used is not particularly limited, and may be such that the dispersion liquid of the fine particles has a viscosity suitable for application. For example, 100 to 100,000 parts by weight of the liquid is used with respect to 100 parts by weight of the fine particles. The amount of the liquid may be suitably selected in accordance with kinds of the fine particles and the liquid.

The dispersion of the fine particles into the liquid may be carried out by a known dispersion technique. For example, the dispersion is carried out by the sand grinder mill method. At the time of dispersion, use of a medium such as zirconia beads is also preferable in order to loosen the agglomeration of the fine particles. Further, at the time of dispersion, one must take care not to mix impurities such as dust.

It is preferable that the dispersion liquid of the fine particles does not contain a resin. In other words, the amount of the resin is preferably zero. In the compressed layer of the conductive fine particles, if the resin is not used, the contact between the conductive fine particles is not inhibited by the resin, the electrical conductivity among the conductive fine particles is ensured, and the electric resistance value of the obtained conductive layer is low. In the compressed layer, if the resin is not used, the volume filling rate of the conductive fine particles tends to be high and voids among the conductive fine particles are ensured to the maximum. In these voids, an organic group-containing metal compound as a precursor of a conductive metal oxide component is impregnated at a later process. The impregnated organic group-containing metal compound is converted into a conductive metal oxide by heat treatment after the transfer onto a surface of an object article. As a result, the electric contacts among the conductive fine particles increase and a transparent electrical conductive film with a lower electric resistance value can be obtained. The resin may be contained in an amount that does not deteriorate the filling properties of the conductive fine particles and the impregnation of the organic group-containing metal compound; however, the amount is, for example, such an amount that the upper limit of the resin contained in the dispersion liquid is less than 25 parts by volume with respect to 100 parts by volume of the conductive fine particles as represented by volume before dispersion.

Various additives may be blended with the dispersion liquid of the fine particles within a range that satisfies the conductivity. For example, the additives such as an ultraviolet absorber, a surfactant, and a dispersant may be blended.

The support (1) is suitably a flexible resin film that is not cracked even if the compression force of the compression step is increased. The resin film is lightweight and can be easily handled. In the present invention, in the production of the conductive film for transfer, since a pressing step at a high temperature or a calcining step is not carried out, the resin film may be used as the support.

As the resin film, for example, polyester film such as polyethylene terephthalate (PET), polyolefin film such as polyethylene and polypropylene, polycarbonate film, acrylic film, norbornene film (Arton manufactured by JSR Co., Ltd., or the like), and others may be mentioned. Besides the resin film, cloth, paper or others may be used as the support.

In the case of the conductive film having the layer constitution of FIG. 2, a surface of the support (1) at the side where the conductive layer (4) should be formed may be subjected to the release treatment as necessary, so that the formed conductive layer (4) is in a state in which the conductive layer (4) is releasable from the support (1). For example, a silicone releasing agent or the like may be applied onto the support surface.

The dispersion liquid of the conductive fine particles is applied onto the resin layer (3) or onto the support (1), and dried to form layers containing the conductive fine particles.

Application of the dispersion liquid of the fine particles is not particularly limited, and may be carried out by a known method. For example, the application may be carried out by the application method such as the reverse roll method, the direct roll method, the blade method, the knife method, the extrusion nozzle method, the curtain method, the gravure roll method, the bar coat method, the dip method, the kiss coat method, the squeeze method, or the like. Further, the dispersion liquid may be allowed to adhere onto the resin layer or the support by atomizing, spraying, or the like.

The drying temperature is preferably about 10 to 150° C. although it depends on a kind of the liquid used for dispersion. If the temperature is lower than 10° C., condensation of moisture in air is liable to occur, whereas if it exceeds 150° C., the resin film support will be deformed. Also, at the time of drying, one must take care not to allow impurities to adhere to the surface of the fine particles.

The thickness of the layer containing the conductive fine particles after application and drying may be about 0.1 to 10 μm, though it depends on the usage of the conductive film finally obtained.

Thus, if the conductive fine particles are dispersed in the liquid for application and drying, it is easy to form a uniform layer. If the dispersion liquid of the fine particles is applied and dried, the fine particles form a layer even if a binder is not present in the dispersion liquid. The reason why the layer is formed even in the absence of the binder is not necessarily clear; however, when the amount of the liquid decreases by drying, the fine particles gather by a capillary force. Further, it seems that, since they are the fine particles, the specific surface area is large and the agglomeration force is strong to form a layer. However, in general, the strength of the layer at this stage is weak. Also, it has a high resistance value and has a large variation of the resistance value.

Thus, it is preferable to compress the formed layer containing the conductive fine particles to obtain a compressed layer of the conductive fine particles. The compression improves the strength of the layer and decreases the electric resistance of the layer. Namely, the compression increases the number of contact points among the conductive fine particles to increase the contact area. For this reason, the strength of the coating layer is increased and the electric resistance is decreased. Since the fine particles are originally liable to be agglomerated, the compression makes a firm layer.

The compression is preferably carried out at a compression force of at least 44 N/mm². If it is carried out at a low pressure of less than 44 N/mm², the layer containing the conductive fine particles cannot be fully compressed and, it is difficult to obtain a conductive layer being excellent in conductivity. A compression force of at least 135 N/mm² is more preferable, and a compression force of at least 180 N/mm² is still more preferable. According as the compression force is higher, the strength of the coating layer is improved, the close adhesive properties between the conductive layer and the support will be improved, and a conductive layer being more excellent in conductivity is obtained. According as the compression force is raised, the pressure resistance of the apparatus must be raised, so that a compression force up to 1000 N/mm² is generally suitable.

Further, the compression is preferably carried out at such a temperature that the support is not deformed. If the support is the resin film, for example, it will be a temperature range below the glass transition temperature (secondary transition temperature) of the resin.

The compression is not particularly limited and may be carried out by sheet press, roll press or the like; however, it is preferably carried out by means of a roll press machine. The roll press is a method in which the film to be compressed is sandwiched between rolls for compression and the rolls are rotated. The roll press is suitable because a high uniform pressure can be applied in the roll press, and the productivity of the roll press is higher than that of the sheet press.

The roll temperature of the roll press machine is preferably an ordinary temperature (an environment suitable for human work) from the viewpoint of productivity. If the compression is carried out in a heated atmosphere or with heated rolls (hot press), there will be a disadvantage such that the resin film is elongated when the compression pressure is increased. If the compression pressure is reduced in order to prevent the resin film of the support from being elongated under heating, the mechanical strength of the conductive layer decreases and the electric resistance rises. It is also preferable to control the temperature so that the roll temperature may not rise by heat generation in the case where continuous compression is carried out by means of the roll press machine.

If there is a reason to reduce the adhesion of moisture to the fine particle surface as much as possible, the heated atmosphere may be adopted in order to reduce the relative humidity of the atmosphere; however, the temperature range is within a range such that the film is not easily elongated. Generally, it will be a temperature range below the glass transition temperature (secondary transition temperature). By taking the variation of humidity into account, it may be set at a temperature which is a little higher than the temperature that achieves the required humidity.

Here, the glass transition temperature of the resin film is determined by measuring the dynamic viscoelasticity, and refers to the temperature at which the dynamic loss of the main dispersion is at its peak. For example, with regard to PET film, its glass transition temperature is approximately around 110° C.

The roll of the roll press machine is preferably a metal roll because a strong pressure can be applied. Also, if the roll surface is soft, the fine particles may be transferred and adhered to the roll surface at the time of compression, so that the roll surface is preferably treated with a hard film such as hard chromium, spraying film of ceramics, a film obtained by ionic plating of TiN, etc., DLC (diamond like carbon), or the like. Further, in order to prevent the fine particles from being transferred and adhered to the roll surface, it is also preferable to carry out the compression with an anti-transfer film interposed between the conductive fine particle containing layer and the roll at the side of the conductive fine particle containing layer. The surface of the anti-transfer film at the side of the conductive fine particle containing layer is preferably treated with a hard coat so as to make it difficult for the fine particles to be adhered to.

Or, the compressed layer of the conductive fine particles can be formed by a transfer method disclosed in Japanese Laid-open Patent Publication No. 2003-1783(2003). That is, the conductive fine particle containing layer is formed onto a hard coat surface of the resin film being furnished with the hard coat. This resin film and the support on which the compressed layer is to be formed are lapped one over the other, in a manner that the conductive fine particle containing layer and the support contact each other, and compressed, thus forming on the support the compressed layer of the conductive fine particles by transfer. After the compression, the resin film is released.

In this manner, the compressed layer of the conductive fine particles is formed. The thickness of the compressed layer of the conductive fine particles may be about 0.1 to 10 μm, though it depends on the usage. Further, in order to obtain a thick compressed layer having a thickness of about 10 μm, a series of operations comprising application of the dispersion liquid of the fine particles, drying, and compression may be carried out repeatedly. Furthermore, in the present invention, it is of course possible to form the conductive layers on both surfaces of the support.

There are voids among the conductive fine particles in the obtained compressed layer of the conductive fine particles. In the present invention, an organic group-containing metal compound as a precursor of the conductive metal oxide component is impregnated in the voids. The impregnation may be performed by applying a coating liquid containing the organic group-containing metal compound onto the compressed layer of the conductive fine particles. As the application method, above-exemplified application methods of the dispersion liquid of the conductive fine particles may be used.

The metal element of the organic group-containing metal compound is selected from indium (In), antimony (Sb), tin (Sn), zinc (Zn), and gallium (Ga). The oxides of these metal elements exhibit the electrical conductivity, and indium is preferable from the viewpoint of the electrical conductivity. Also, as dope elements, indium, antimony, tin, aluminum, gallium, boron, and the like may be added in a form of an organic group-containing metal compound. As such compound, those exemplified in Japanese Laid-open Patent Publication Nos. 2000-207959(2000) and 2001-2954(2001) can be used. Adeka ITO-L and Adeka ITO-P (each of which is produced by Asahi Denka Co., Ltd.) are commercially available.

From the viewpoint of the amount of the organic group-containing metal compound to be impregnated, the organic group-containing metal compound may be impregnated so much as filling all voids in the conductive layer after compression or may be impregnated so much as leaving some of the voids remain unfilled. A large amount of the organic group-containing metal compound may be impregnated so much as forming on the conductive layer a layer of the organic group-containing metal compound. In this case, the thickness of the layer of the organic group-containing metal compound is preferably 0.2 μm or less, since a crack may occur by heat treatment if the thickness of the layer becomes thick.

In the above manner, the conductive layer (4) is formed.

The organic group-containing metal compound is converted into a conductive metal oxide by heat treatment at 190 to 2000° C. after the transfer to the surface of the object article. As a result, a conductive metal oxide component comes to exist in the voids among the conductive fine particles, the filling amount of the conductive substance per volume tends to be high, the electric contacts among the conductive fine particles increase, and thus a transparent conductive film having a lower electric resistance value can be obtained.

The temperature of the heat treatment in order to convert the organic group-containing metal compound into the conductive metal oxide can be suitably selected in accordance with the object article to be transferred. For example, when the object article is plastic, the temperature may be relatively low (e.g. 190 to 250° C.) and in this case it is necessary that the organic group-containing metal compound is converted into oxide at such a low temperature. When the object article is glass or ceramics, the temperature may be relatively high (e.g. 250 to 2000° C., preferably 350 to 1200° C.), and the most suitable temperature may be suitably selected in a temperature range of the heat-resisting temperature of the object article. The conductive film having a low electric resistance value is more likely to be obtained when treated at a higher temperature. Also, the transparent conductive film having a still lower electric resistance value can be obtained if the conductive fine particles are sintered due to the heat treatment at a high temperature.

The object article (6) is not particularly limited, and may be various articles which are not deformed or extinguished during heat treatment. Examples thereof include a board article or support poor in flexibility, on which a coating layer having a uniform thickness is not easily formed, and substances on which a compressed layer is not directly formed with ease, such as glass, ceramic or metal. For example, the surface of a CRT is desired to be subjected to treatments for antistatics, the shielding of electromagnetic waves, antireflection and others. CRTs are specific examples of the object article in the present invention.

The conductive film for transfer according to the present invention includes two types dependent on whether or not the surface of the conductive layer is exposed when the conductive layer is transferred onto a surface of an object article to be transferred.

The following describes the conductive film for transfer of the first type, wherein the surface of the conductive layer is not exposed:

The film of the first type is the conductive film for transfer wherein an intermediate layer releasable from the support is formed on the support, the conductive layer is formed on the releasable intermediate layer, and the releasable intermediate layer can be released together with the conductive layer from the support. When this conductive film of the first type is used to transfer the conductive layer on a surface of an object article to be transferred, the conductive layer is transferred on the surface of the object article, and the releasable intermediate layer is present on the conductive layer.

The following describes the conductive film for transfer of the second type, wherein the surface of the conductive layer is exposed.

The film of the second type is the conductive film for transfer wherein a base layer is formed on the support, the conductive layer is formed on the base layer, and the conductive layer can be released from the base layer.

The base layer is a layer which is not substantially released from the support at the time of transfer. In other words, the film of the second type is the conductive film for transfer wherein an intermediate layer unreleasable from the support is formed on the support, the conductive layer is formed on the unreleasable intermediate layer, and the conductive layer can be released from the support and the unreleasable intermediate layer.

When this conductive film of the second type is used to transfer the conductive layer onto a surface of an object article to be transferred, the conductive layer is transferred on the surface of the object article and the surface of the conductive layer is exposed.

In the conductive film for transfer of the second type, the base layer, that is, the unreleasable intermediate layer may be a resin layer made mainly of a resin.

Figure 3:
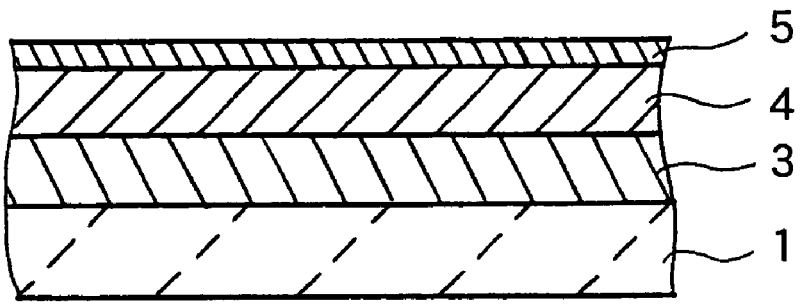
FIG. 3 is a cross-sectional view illustrating one example of the conductive film for transfer in the present invention.

FIG. 3 is a cross-sectional view illustrating a layer structure example of a conductive film wherein a resin layer (3), a conductive layer (4) and an adhesive layer (5) are formed, in this order, on a support (1). The resin layer (3) is a releasable intermediate layer in the first type, or is a base layer, that is, an unreleasable intermediate layer in the second type. In the first type, the surface of the support (1) on the resin layer (3) side is subjected to releasing treatment. At the time of transfer, the release occurs between the support (1) and the resin layer (3). In the second type, the close adhesive property between the support (1) and the resin layer (3) is high. Thus, at the time of transfer, the release occurs between the resin layer (3) and the conductive layer (4).

In the case of the first type conductive films having the layer structure of FIG. 3, a surface of the support (1) at the side of the resin layer (3) may be subjected to the release treatment in accordance with affinity of resin materials being composed of the resin layer (3) with the support (1), so that the release occurs between the support (1) and the resin layer (3) at the time of transfer.

In the case of the second type conductive film having the layer structure of FIG. 3, it is preferable that the resin layer (3) has relatively high hardness, for example, pencil hardness of 2 H or harder and 4 H or softer, so that the release occurs between the resin layer (3) and the conductive layer (4) at the time of transfer. It is also preferable that close adhesive properties between the support (1) and the resin layer (3) are high. For the resin layer (3) in the second type, relatively hard resins may be used, and as such resins, resins capable of obtaining relatively high hardness are used from acrylic resins, urethane resins, vinyl chloride resins, silicone resins or the like. The resin layer may contain fine particles such as silica for controlling hardness of the resin layer. After compression, the resin layer may be cured by heat, ultraviolet rays, or the like.

The resin of the resin layer (3) in the conductive film of the first type and the second type is preferably insoluble into the liquid in which the conductive fine particles are dispersed. In the conductive layer, if the resin layer is dissolved, the solution containing the resin comes around the conductive fine particles by capillary phenomenon, and the filling rate of the fine particles decrease. As a result, the electric resistance value of the obtained conductive layer is raised. The thickness of the resin layer (3) is, for example, 0.005 to 20 μm, preferably 0.01 to 5 μm.

In the conductive films for transfer of the first and second types of the present invention, an adhesive layer (5) is formed on the conductive layer (4).

The adhesive used for the adhesive layer (5) of the conductive film for transfer in the present invention and for the adhesive layer provided beforehand on the object article to be transferred is not particularly limited, and various known adhesives may be used as long as the adhesive has an affinity with both of the conductive layer (4) of the conductive film and the surface of an object article to be transferred and is capable of firmly sticking the conductive layer (4) and the surface of an object article to be transferred. As the examples thereof, acrylic type adhesive, epoxy type adhesive, isocyanate type adhesive, silicone type adhesive, or the like may be mentioned. The adhesive may be those which can be cured by ultraviolet rays or heat after the transfer onto an object article to be transferred. The adhesive may also be a hot-melt type adhesive.

As the adhesive used for the adhesive layer (5) of the conductive film in the present invention, such an adhesive is preferable as those capable of providing an adhesive layer which has tacky feeling by only applying an adhesive solution and then drying the solution and capable of providing a cured layer which is very hard by curing the adhesive layer with ultraviolet rays after sticking the adhesive layer onto an object article to be transferred. Softening or deterioration of the adhesive layer after the transfer onto an object article to be transferred is not preferable.

The adhesive layer (5) is preferably made of an adhesive composition comprising at least an acrylic type monomer (M).

As an adhesive used for the adhesive layer in the aforementioned case wherein the heat treatment is performed at a low temperature, the following adhesive composition is found out to be suitable.

1. An adhesive composition comprising a polymer resin component having the glass transition temperature Tg of 30° C. or more and a curable low molecular component at a weight ratio P/M of 8/2 to 2/8.
2. The adhesive composition according to aforementioned 1, wherein the polymer resin component is solid at ambient temperature and the curable low molecular component is liquid at ambient temperature.
3. The adhesive composition according to aforementioned 1 or 2, wherein the polymer resin component is a polymer resin (P) selected from the group consisting of acrylic type resin and cellulose type resin, and the curable low molecular component is acrylic type monomer (M).
4. The adhesive composition according to any one of aforementioned 1 to 3, said adhesive composition further comprises a photopolymerization initiator.
5. The adhesive composition according to any one of aforementioned 1 to 4, said adhesive composition is cured by light irradiation.

Since the polymer resin component is solid at ambient temperature and the curable low molecular component is liquid at ambient temperature, a pressure sensitive adhesive layer can be easily formed, which has stickiness and becomes a cured substance by giving a stimulus. The pressure sensitive adhesive layer may have a moderate stickiness.

Further, in the aforementioned case wherein heat treatment is performed at the relatively high temperature, since the adhesive layer comprises the silicone type resin (S), it is possible to keep sure adhesion of the conductive layer onto the surface of the object article to be transferred on the basis of the adhesive layer made mainly of $SiO_2$ even after the acrylic type resin component and/or cellulose type resin component in the cured layer is extinguished by heat-treating at high temperature after the support is released. The heat-treated adhesive layer in this case may be not necessarily a complete layer. For example, the heat-treated adhesive layer may be present sparsely between the conductive layer and the article.

In order to obtain good tackiness at the initial stage, hardness after curing, and excellent adhesion performance after heat treatment, it is preferable that the adhesive layer comprises the polymer resin (P) and the acrylic type monomer (M) as solid contents at a weight ratio P/M of 0/10 to 8/2 and comprises the silicone type resin (S) as a solid content at a weight ratio of the silicone type resin (S) to the total (P+M) of the polymer resin (P) and the acrylic type monomer (M), i.e., a weight ratio S/(P+M) of 0.01/100 to 50,000/100. Since the acrylic type monomer (M) is a liquid at ambient temperature, only the silicone type resin (S) takes charge of the initial tackiness when the adhesive layer comprises no polymer resin (P). When the adhesive layer comprises the polymer resin (P), which is a solid at ambient temperature, the initial tackiness based on the polymer resin (P) is obtained. In order to obtain the initial tackiness based on the polymer resin (P), it is preferable that P/M is from 2/8 to 8/2. If the P/M is larger than 8/2, the initial tackiness tends to lower. If the P/M is smaller than 2/8, the viscosity of the adhesive composition solution becomes too low. Thus, when the film is stuck onto the article, inconveniences may be caused. If the S/(P+M) is smaller than 0.01/100, the adhesive performance after the adhesive layer is heat-treated tends to lower. If the S/(P+M) is larger than 50,000/100, the initial tackiness tends to get small. It is more preferable that the adhesive layer comprises the polymer resin (P) and the acrylic type monomer (M) at a weight ratio P/M of 2/8 to 8/2 and comprises the silicone type resin (S) at a weight ratio of the silicone type resin (S) to the total (P+M) of the polymer resin (P) and the acrylic type monomer (M), i.e., a weight ratio S/(P+M) of 0.5/100 to 100/100.

As the acrylic type resin as the polymer resin (P) a known resin may be used. Examples thereof include acrylic resins 103B and 1BR-305 (each of which is produced by Taisei Chemical Industries Ltd.). As the acrylic type monomer (M), a known monomer may be used. Examples thereof include tri- or more-functional acrylic type monomers such as KAYARAD GPO-303, KAYARAD TMPTA, and KAYARAD THE-330 (each of which is produced by Nippon Kayaku Co., Ltd.).

It is preferable that the cellulose type resin as a polymer resin (P) comprises an ester bond in a part of its structure. As ester, acetate, butyrate, propionate, or the like may be mentioned. The cellulose type resin comprising one or more of these esters may be used. More specifically, cellulose acetate butyrate (CAB; CAS No. 009004-36-8) and cellulose acetate propionate (CAP) may be mentioned.

As the silicone type resin (S), known various resins, such as straight silicone, silicone acryl and silicone epoxy, may be used. Examples thereof include FRESCERA N (produced by Matsushita Electric Industrial Co., Ltd.) and TSR-144 (produced by GE Toshiba Silicones Co., Ltd.). A silicone resin is liquid in the state of varnish, but becomes a solid when solvent volatilizes. A silicone resin is generally nonvolatile, and is heat-treated, thereby becoming silicon dioxide or a silicon dioxide analogue having an organic residue in partial Si. Since a silicone monomer is liquid and volatile, the monomer volatilizes during the heat treatment. Thus, in the present invention, a silicone resin is used.

In the case that there are demands such that the close adhesive property between the object article to be furnished with the conductive layer and the adhesive layer is made high at the time of transfer, a silicone monomer together with the silicone resin may be added to the adhesive layer.

Usually, the adhesive layer further comprises a photopolymerization initiator. As the photopolymerization initiator, various photopolymerization initiators may be used. Examples thereof include KAYACURE DETX-S (produced by Nippon Kayaku Co., Ltd.). The amount of the photopolymerization initiator may be set to about 0.01 to 20% by weight with respect to the total weight (P+M) of the acrylic type resin (P) and the acrylic type monomer (M). The adhesive layer is cured by irradiation with active energy rays such as ultraviolet rays, thereby improving the productivity when the conductive film for transfer is stuck onto the object article. As the photopolymerization initiator, a known substance wherein a photopolymerization initiator is added to an acrylic type monomer may also be used. Examples of the substance, wherein a photopolymerization initiator is added to an acrylic type monomer, include ultraviolet curable resin SD-318 (produced by Dainippon Ink & Chemicals, Inc.) and XNR 5535 (produced by Nagese ChemteX Corp.).

If necessary, additives such as an ultraviolet absorbent and an infrared absorbent, and oligomer may be incorporated into the adhesive.

A releasable film may be given onto the adhesive layer (5) of the conductive film for transfer according to the present invention in order to protect the surface of the adhesive layer up to the use thereof.

The formation of the adhesive layer (5) may be performed by applying a solution of the adhesive composition onto the conductive layer (4). The adhesive layer (5) may be formed on the conductive layer (4) by forming an adhesive layer on a separately-prepared support for release, which is subjected to release treatment, and then laminating to stick (closely adhere) so that the adhesive layer on the support for release and the conductive layer (4) on the support (1) contact with each other. In this case, at the same time of the formation of the adhesive layer (5), the support for release is given on the adhesive layer to protect the surface of the adhesive layer up to the use time thereof. The conductive layer (4) is impregnated with a part of the adhesive. The thickness of the adhesive layer, which depends on the tackiness of the adhesive, may be set to about 0.1 to 100 μm, more preferably about 1 to 20 μm before heat treatment.

In the present invention, it is also preferable that the compressed layer of the conductive fine particles is subjected to heat treatment after formation of the compressed layer of the conductive fine particles and before impregnation of the organic group-containing metal compound. By the heat treatment, internal stress remained in the resin layer at the forming time of the compressed layer is relaxed so that corrosion resistance of the conductive film against various materials or various solvents is improved.

Conditions for the heat treatment may be suitably selected. For relaxation of the internal stress, a temperature of the heat treatment is preferably 50° C. or higher, more preferably 80° C. or higher. Upper limit of the temperature of the heat treatment is, for example, normally 130° C. in the case that the resin film is used as the support. Heat treatment time is also normally in a range of 1 minute to 100 hours, preferably in a range of 10 minutes to 50 hours, further preferably in a range of 30 minutes to 25 hours. An atmosphere at the time of the heat treatment may be an atmosphere under vacuum, reduced pressure, air, nitrogen gas or inert gas such as argon.

Next, a method for forming a transparent conductive film using a conductive film for transfer and transparent conductive film will be described. Example of the layer constitution of an article provided with the conductive layer (4) of the conductive films of the first type and the second type described above is shown in FIG. 4.

Figure 4:
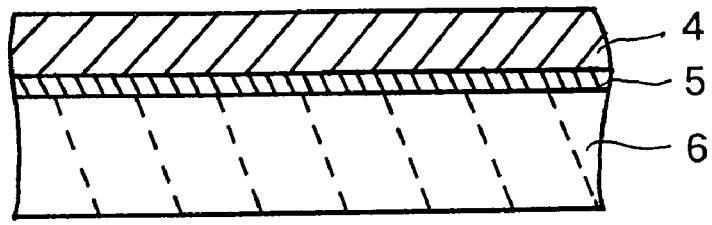
FIG. 4 is a cross-sectional view illustrating one example of the article furnished with the conductive layer in the present invention.

FIG. 4 is a cross-sectional view illustrating an example of the layer constitution in which the conductive layer (4) is provided to a surface of the object article (6) through the adhesive layer (5). Namely, FIG. 4 illustrates an example in which the conductive layer (4) is transferred using the conductive film shown in FIG. 2, or using the second type conductive film shown in FIG. 3.

In order to obtain the article provided with the conductive layer of the present invention, first, the conductive layer (4) of the conductive film described above is transferred from the support (1) to the object article (6). Namely, the conductive film is stuck onto a surface of the object article (6) through the adhesive layer (5) of the conductive film so that the support (1) faces outside, thereafter, the adhesive layer (5) is cured preferably by irradiation of ultraviolet rays. Then, the support (1) of the conductive film is released. After transfer, the heat treatment is performed to form a conductive layer which reveals a higher function. Alternatively, in the case that an adhesive layer (5) is not provided to the conductive film, the similar adhesive as used in the adhesive layer (5) may be applied in advance onto a surface of the object article (6) at the time of transfer.

Figure 5:
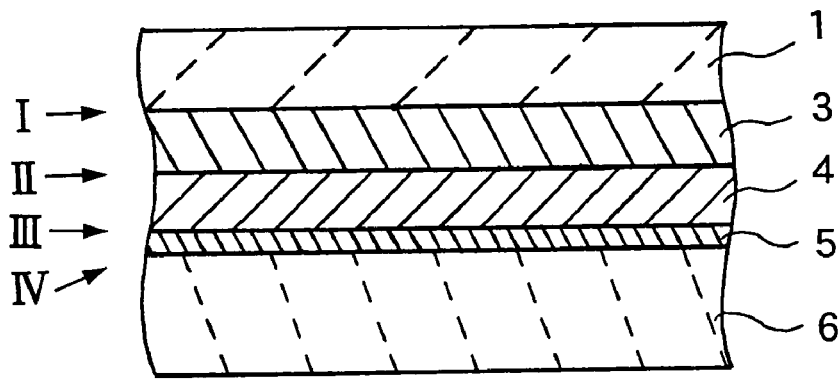
FIG. 5 is a view for describing release at the time of transfer using the conductive film for transfer in the present invention.
Figure 5:
Figure 5:
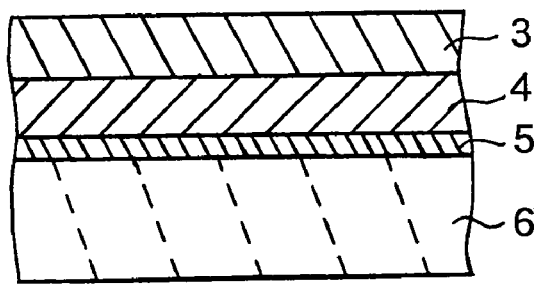
Figure 5:
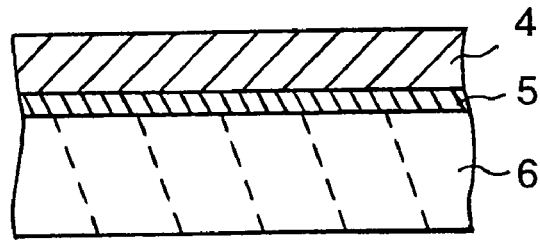

FIG. 5 is a view for describing release at the time of transfer. In FIG. 5, (a) illustrates a state in which the conductive film of the first type or the second type shown in FIG. 3 is stuck onto a surface of the transfer-object article (6). Here, in the present invention, the terms "releasable" and "not to be released" are used for representing behavior of the layers at the time of transferring to the object article as described below. Therefore, the terms do not mean absolute strength of adhesion.

Relationships of each layer in the present invention will be described referring to FIG. 5 as an example. Regarding close adhesion between the resin layer (3) and the conductive layer (4), it seems that a part of the conductive fine particles of the conductive layer (4), which contact with the resin layer (3), is embedded in the resin layer (3) by compression, so that the conductive layer (4) closely glues to the resin layer (3). Therefore, close adhesive properties of both layers (3) and (4) tend to be high in the case that compression force is high, and close adhesive properties of both layers (3) and (4) are high in the case that the resin layer (3) tends to be softer. The close adhesion force varies depending on the kind, shape, particle diameter, or others of the conductive file particles, and also varies depending on presence or absence, the kind, or others of the resin contained in the layer of the conductive fine particles at the time of compression.

In FIG. 5, an interface between the support (1) and the resin layer (3) (referred to as an interface I), an interface between the resin layer (3) and the conductive layer (4) (referred to as an interface II), an interface between the conductive layer (4) and the adhesive layer (5) (referred to as an interface III), and an interface between the adhesive layer (5) and the object article (6) (referred to as an interface IV) exist. In the present invention, the invention of the first type can be achieved by lowering the close adhesive properties at the interface I in comparing with the close adhesive properties at the other interfaces. Also, the invention of the second type can be achieved by lowering the close adhesive properties at the interface II in comparing with the close adhesive properties at the other interfaces.

In order to lower the close adhesive properties at the interface I in comparing the close adhesive properties at the other interfaces, close adhesive properties of the support (1) with the resin layer (3) may be lowered. Therefore, release treatment may be applied to a surface of the support (1) at the side of the resin layer (3), so that the release occurs between the support (1) and the resin layer (3) at the time of transfer. Further, the close adhesive properties at the other interfaces may be raised. In order to raise the close adhesive properties of the resin layer (3) with the conductive layer (4), the resin layer may be relatively soft.

In order to lower the close adhesive properties at the interface II in comparing the close adhesive properties at the other interfaces, the close adhesive properties of the resin layer (3) with the conductive layer (4) may be lowered. According as a hardness of the resin layer (3) is relatively high, the close adhesive properties of the compressed layer with the resin layer become lower. However, if the resin layer (3) is a layer being hard such as hard-coating, the close adhesive properties become too low. Generally, it is preferable that the resin layer (3) has relatively high hardness, for example, the pencil hardness of about 2 H to 4 H. Further, the close adhesive properties at the other interfaces may be raised. In order to raise the close adhesive properties of the support (1) with the resin layer (3), a surface of the support (1) may be subjected to the treatment for making adhesion easy (for example, corona treatment) to raise the close adhesive properties.

At the time of releasing the support (1), in the case of the first type conductive film, the release occurs between the support (1) and the soft resin layer (3) (an arrow I in the figure). The close adhesive properties of the conductive layer (4) with the soft resin layer (3) are good, so that the release does not occur between the conductive layer (4) and the resin layer (3). Therefore, as shown in (b), the conductive layer (4) is provided to a surface of the object article (6) through the adhesive layer (5), so that the resin layer (3) exists on the conductive layer (4).

By heat treating at relatively high temperature after this transferring operation, the resin layer (3) generally becomes extinct in the case that the resin layer (3) is made of a resin comprising only organic components. In the case that the resin layer (3) is a resin comprising Si (silicon), siloxane bonds are formed by the heat treatment so that the resin layer (3) turns to a hard coat. In the case that the resin layer is heat-treated at relatively low temperature, the resin layer does not become extinct.

In the conductive film of the second type, at the time of releasing the support (1), the close adhesive property between the conductive layer (4) and the hard resin layer (3) is low so that the release occurs between the resin layer (3) and the conductive layer (4) (an arrow II in the figure). As illustrated in (c), therefore, the conductive layer (4) is given through the adhesive layer (5) onto the surface of the object article (6) and the surface of the conductive layer (4) is in a state that the surface is exposed. By heat-treating after this transferring operation, the article (6) furnished with the conductive layer (4) is obtained. The conductive film of the second type is suitable for the case that an exposed conductive layer is desired to be provided onto an article surface.

The conductive film of the first type or the second type may be produced mainly by selecting the raw material and the hardness of the resin layer (3).

When the conductive layer is transferred, the object article to be transferred may be subjected to surface treatment in advance. In the case that the object article to be transferred is made of, for example, glass, the surface thereof may be subjected to surface treatment with a silane coupling agent or the like.

Since the adhesive layer of the conductive film for transfer according to the present invention or the adhesive layer provided beforehand on the object article surface preferably comprises the silicone type resin (S) at the time of the heat treatment at relatively high temperature, sure adhesion between the conductive layer and the surface of the object article to be transferred can be maintained even by the relatively high-temperature heat-treatment. In other words, the organic components, such as the acrylic type components, in the adhesive layer are extinguished by the heat treatment while the silicone resin components become silicon dioxide or a silicon dioxide analogue having, in partial Si, organic residues by the heat treatment. Silicon dioxide or the silicon dioxide analogue is a substantially inorganic material and has a high melting point, and is a solid even in an environment having a considerably high temperature. Thus, silicon dioxide or the silicon dioxide analogue remains between the conductive layer and the object article. Therefore, the sure adhesion therebetween can be maintained.

Since the conductive layer is a compressed layer of conductive fine particles, the surface of the conductive layer has concave-convex when the surface is very microscopically viewed. In the case that the amount of the silicone type resin in the adhesive layer is small, the adhesive layer after the heat treatment at relatively high temperature can be made very thin. For this reason, convex portions of the conductive layer surface can be brought into contact with the object article. On the other hand, in the case that the amount of the silicone type resin in the adhesive layer is made large, the adhesive layer after the heat treatment at relatively high temperature becomes thick. For example, the diffusion of sodium ions from glass (the object article) to the conductive layer can be prevented.

In the present invention, inorganic fine particles may be incorporated into the adhesive layer. For example, there is a case in which a conductive layer is transferred through the adhesive layer onto a metal electrode to be formed thereon, whereby the metal electrode and the conductive layer are desired to be electrically connected with each other. In such a case, one or more of fine particles such as ITO fine particles and ATO fine particles are incorporated into the adhesive layer, whereby electric connection between the metal electrode and the conductive layer can be obtained even if the adhesive layer is relatively thick.

After the heat treatment, annealing treatment is preferably performed. The annealing treatment may be performed by putting the layer-transferred and heat-treated object article into, for example, a reduced pressure at 200 to 300° C. or a nitrogen atmosphere or hydrogen atmosphere at 200 to 700° C. The annealing treatment causes the state of oxygen deficiency. Thus, the electric resistance value of the conductive layer becomes lower.

As described above, it is possible to form an article furnished with a transparent conductive film, having on a surface of the article an adhesive layer made mainly of organic substances in the case of relatively low-temperature heat treatment and made mainly of silicon dioxide in the case of relatively high-temperature heat treatment, and having on the adhesive layer a transparent conductive film comprising the conductive fine particles which constitute a compressed layer of the conductive fine particles and a conductive metal oxide component which exists among the conductive fine particles.

EXAMPLES

Hereafter, the present invention will be described with reference to Examples thereof; however, the present invention is not limited to these Examples alone.

Example 1

An electrical conductive film for transfer of the second type having, on a support (1), a resin layer (3), a conductive layer (4) and an adhesive layer (5) in this order was produced, as illustrated in FIG. 3.

(Formation of Anti-transfer Film Used at Compression)

One surface of a PET film having a thickness of 50 μm (T100-50, produced by Mitsubishi Polyester Film Corporation) was subjected to corona treatment so that the contact angle thereof with pure water was made into 40°. A silicone hard coat solution KP-854 (produced by Shin-Etsu Chemical Co., Ltd.) was applied onto the corona-treated surface of the PET film, dried and cured at 70° C. for 48 hours to form a silicone hard coat having a thickness of 0.4 μm. In this way, the anti-transfer film to be used at the time of compression was prepared in advance.

(Formation of Hard Resin Layer)

One surface of a PET film (1) having a thickness of 50 μm (T100-50, produced by Mitsubishi Polyester Film Corporation) was subjected to corona treatment so that the contact angle thereof with pure water was made into 40°. 100 parts by weight of an A solution of silicone resin solution FRESCERA N-180 (produced by Matsushita Electric Industrial Co., Ltd.) were mixed with 360 parts by weight of a B solution thereof to prepare a coating solution for a resin layer. The coating solution was applied onto the corona-treated surface of the PET film (1), dried and cured at 70° C. for 48 hours to form a silicone resin layer (3) having a thickness of 0.4 μm.

(Formation of Conductive Layer)

To 100 parts by weight of ITO fine particles, SUFP-HX (produced by Sumitomo Metal Mining Co., Ltd.) having a primary particle diameter of 5 to 30 nm were added 300 parts by weight of ethanol, and dispersion was performed with a disperser using zirconia beads as media. The resultant coating solution was applied onto the resin layer (3) with a bar coater, and then hot wind of 100° C. was sent so as to dry the layer. The resultant film will be referred to as the ITO film before compression hereinafter. The thickness of the ITO-containing coating film was 1.7 μm.

First, a preliminary experiment was made in order to check compression pressure.

A roll press provided with a pair of metal rolls having a diameter of 350 mm (the surface of the roll being subjected to hard chromium plating treatment) was used to sandwich the anti-transfer film and the ITO film before compression lapped one over the other in a manner that the hard coat surface of the anti-transfer film and the ITO surface of the ITO film before compression contact each other and to compress the films at room temperature (23° C.) without rotating the rolls and heating the rolls. At this time, the pressure per unit length in the direction of the film width was 1100 N/mm. Next, the pressure was released and the length of the compressed portion in the direction of the film length was examined. As a result, the length was 3.0 mm. This results demonstrates that a compressing pressure of 367 N/mm$^2$ was applied per unit area.

Next, the same anti-transfer film and ITO film before compression as used in the preliminary experiment were lapped one over the other and sandwiched between metal rolls, and then the films were compressed under the above-mentioned conditions. The rolls were rotated so as to compress the films at a feed speed of 15 m/minute. At this time, when passing through the rolls, the anti-transfer film and the ITO film before compression were separated without close adhesion. In this way, the film comprising an ITO compressed layer was produced on the hard resin layer (this will be referred to as an ITO compressed film). The thickness of the ITO compressed layer was 1.0 μm.

(Relaxation of Stress)

The obtained ITO compressed film was put in the atmosphere having the temperature of 50° C. and the dew point of −40° C. for 72 hours so as to relax the stress.

(Impregnation of Organic Group-containing Metal Compound)

A solution (solvent is aromatic hydrocarbons) comprising In(OCOH)$_3$ and t-butoxy tin (IV) at the ratio (element ratio) of In/Sn of 90/10 was applied onto the ITO compressed layer with a bar coater and impregnated into the voids in the ITO compressed layer. The solution was impregnated up to the surface of the ITO compressed layer, and subsequently dried to remove the solvent. The thickness of the ITO compressed layer after the impregnation operation was 1.0 μm, which remained unchanged within the range of measurement precision. In this way, the conductive layer (4) is formed.

(Formation of Adhesive Layer)

To 98 parts by weight of an acrylic type resin 103 B (Tg: about 40° C., solid concentration: 50% by weight, produced by Taisei Chemical Industries Ltd.) were added 50 parts by weight of an ultraviolet curable type resin SD-318 (produced by Dainippon Ink & Chemicals, Inc.), and 7 parts by weight of a B solution of a silicone resin solution FRESCERA N-180 (solid concentration: 16% by weight, produced by Matsushita Electric Industrial Co., Ltd.), so as to prepare a coating solution for adhesive layer. The coating solution was applied onto the conductive layer (4) and dried to form an adhesive layer (5) having a thickness of 3.5 μm. When the adhesive layer (5) was fingered, tackiness was felt. In this way, a conductive film for transfer was obtained.

(Transfer of Conductive Layer onto Glass Plate)

First, an object glass plate was subjected to surface treatment. To 100 parts by weight of a silane coupling agent KBM 503 (produced by Shin-Etsu Chemical Co., Ltd.) were added 0.9 part by weight of acetic acid (1 N) and 21 parts by weight of water to hydrolyze. To 1 part by weight of the hydrolyzed silane coupling agent solution were added 100 parts by weight of ethanol to prepare a surface treatment solution. A cotton swab was used to apply the surface treatment solution onto the glass plate and, the resultant was dried. The glass plate was put into the atmosphere of 110° C. for 5 minutes to cause the silane coupling agent to react with the glass. Thereafter, an excess of the silane coupling agent on the glass plate was wiped with a cloth into which ethanol was incorporated.

Next, the resultant conductive film for transfer was stuck by means of a laminator so as to bring the adhesive layer (5) into contact with the surface-treated glass plate. The ultraviolet rays were irradiated to cure the adhesive layer (5). After the curing, the support PET film (1) was released. The adhesive layer (5) was very strong.

(Heat Treatment After Transfer)

After the curing, the glass plate furnished with the conductive layer (4) was put in the atmosphere of 500° C. air for 1 hour to burn organic components of the organic indium contained in the conductive layer (4) as well as organic components in the adhesive layer (5). Thereafter, the temperature of the atmosphere was lowered to 200° C. over 2 hours. Next, the glass plate was put into the atmosphere under a reduced pressure (0.1 atm) at 200° C., and the temperature was lowered to 50° C. over 5 hours. The glass plate was taken out and the temperature was lowered to room temperature (23° C.).

The adhesive layer (5) was very strong after the heat treatment also. In this way, the conductive layer (4) was given through the adhesive layer (5) onto the glass plate (6), as illustrated in FIG. 4.

(Electric Resistance)

A non-contact type resistance measuring device (MODEL 717B, produced by Coper Electronics Co., Ltd.) was used to measure the electric resistance of the conductive layer (4). As a result, it was 70 Ω/□.

Comparative Example 1

A conductive film for transfer was obtained in the same way as in Example 1 except that no impregnating operation of the organic group-containing metal compound was performed. The resultant conductive film for transfer was used to transfer the conductive layer onto a glass plate and the heat treatment was performed in the same way as in Example 1. The electric resistance of the conductive layer was measured. As a result, it was 100 Ω/□.

In the Example, examples wherein ITO fine particles were used to produce a conductive film for transfer and the conductive layer was given to a glass plate have been shown. As object articles, various articles to each of which a conductive layer needs to be given may, of course, be selected. Further, the conductive film according to the present invention is characterized by the conductive layer, wherein the organic group-containing metal compound exists as a precursor of a conductive metal oxide component in the voids among conductive fine particles. The present invention is not limited to a conductive film of those types for transfer, and includes a conductive film of those types for non-transfer having a conductive layer formed on the support with excellent close adhesive property. Therefore, the above-mentioned Example is merely illustrative of the present invention in all points, and the present invention should not be restrictedly interpreted. Furthermore, all modifications belonging to a scope equivalent to the claims are included in the scope of the present invention.

The invention claimed is:

1. A method for producing an article provided with an electrical conductive film, characterized by:

sticking an electrical conductive film for transfer comprising at least a conductive layer on a support, said conductive layer being releasable from the support, wherein the conductive layer comprises conductive fine particles and an organic group-containing metal compound of a metal element, an oxide of which exhibits an electrical conductivity, onto a surface of an object article to be furnished with said electrical conductive film so as to position the support outside through an adhesive layer of the conductive film, and/or an adhesive layer comprising at least an acrylic monomer (M) and being provided beforehand on the surface of the object article;

curing the adhesive layer after the sticking;

releasing the support; and then performing heat treatment to convert the organic group-containing metal compound in the conductive layer into a metal oxide.

2. An electrical conductive film for transfer comprising at least a conductive layer on a support, said conductive layer being releasable from the support, wherein the conductive layer comprises conductive fine particles and an organic group-containing metal compound of a metal element, an oxide of which exhibits an electrical conductivity, wherein an adhesive layer is further provided on the conductive layer, said adhesive layer comprising:
at least an acrylic monomer (M),
at least one resin of a polymer resin (P) selected from the group consisting of an acrylic resin and a cellulose resin, and
a silicone resin (S),
wherein the adhesive layer comprises the polymer resin (P) and the acrylic monomer (M) at a weight ratio P/M of 0/10 to 8/2, and comprises the silicone resin (S) at a weight ratio of the silicone resin (S) to the total (P+M) of the polymer resin (P) and the acrylic monomer (M),S/(P+M), of 0.01/100 to 50,000/100.

3. The electrical conductive film for transfer according to claim 2, wherein said metal element of the organic group-containing metal compound is selected from the group consisting of indium, antimony, tin, zinc, and gallium.

4. The electrical conductive film for transfer according to claim 2, wherein the conductive layer is a layer of conductive fine particles being impregnated with the organic group-containing metal compound.

5. The electrical conductive film for transfer according to claim 4, wherein the layer of conductive fine particles is a compressed layer of conductive fine particles.

6. The electrical conductive film for transfer according to claim 2, wherein said support comprises a surface adjacent said conductive layer, said support surface being treated with a silicone releasing agent.

7. An article furnished with a transparent electrical conductive film comprising: an adhesive layer on a surface of the article, and said transparent electrical conductive film on the adhesive layer, said transparent electrical conductive film comprising a conductive layer which constitutes a layer of conductive fine particles, wherein voids in the layer of conductive fine particles are filled with a component consisting of an electrically conductive metal oxide component, wherein said adhesive layer comprises:
at least an acrylic monomer (M),
at least one resin of a polymer resin (P) selected from the group consisting of an acrylic resin and a cellulose resin, and
a silicone resin (S),
wherein the adhesive layer comprises the polymer resin (P) and the acrylic monomer (M) at a weight ratio P/M of 0/10 to 8/2, and comprises the silicone resin (S) at a weight ratio of the silicone resin (S) to the total (P+M) of the polymer resin (P) and the acrylic monomer (M),S/(P+M), of 0.01/100 to 50,000/100.

8. The article furnished with the transparent electrical conductive film according to claim 7, wherein the layer of the conductive fine particles is a compressed layer of conductive fine particles.

9. An electrical conductive film for transfer comprising at least a conductive layer on a support, said conductive layer being releasable from the support, wherein the conductive layer comprises conductive fine particles and an organic group-containing metal compound of a metal element, an oxide of which exhibits an electrical conductivity, wherein an adhesive layer is further provided on the conductive layer, said adhesive layer comprising:
at least an acrylic monomer (M),
at least one resin of a polymer resin (P) selected from the group consisting of an acrylic resin and a cellulose resin, and
a silicone resin (S),
wherein the adhesive layer comprises the polymer resin (P) and the acrylic monomer (M) at a weight ratio P/M of 0/10 to 8/2, and comprises the silicone resin (S) at a weight ratio of the silicone resin (S) to the total (P+M) of the polymer resin (P) and the acrylic monomer (M), S/(P+M), of 0.01/100 to 50,000/100, and
wherein, upon adhesion of said adhesive layer to an object article, an interface between said adhesive layer and said object article has greater close adhesive properties than the close adhesive properties at another interface between said support and said conductive layer.

* * * * *